United States Patent
Huang et al.

(10) Patent No.: US 11,607,870 B2
(45) Date of Patent: Mar. 21, 2023

(54) MONOLITHIC INTEGRATION OF HYBRID PEROVSKITE SINGLE CRYSTALS WITH SILICON FOR HIGHLY SENSITIVE X-RAY DETECTORS

(71) Applicant: NUtech Ventures, Lincoln, NE (US)

(72) Inventors: Jinsong Huang, Lincoln, NE (US); Wei Wei, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 17/745,598

(22) Filed: May 16, 2022

(65) Prior Publication Data

US 2022/0281214 A1   Sep. 8, 2022

Related U.S. Application Data

(60) Division of application No. 16/241,071, filed on Jan. 7, 2019, now Pat. No. 11,345,123, which is a continuation of application No. PCT/US2017/040969, filed on Jul. 6, 2017.

(60) Provisional application No. 62/359,110, filed on Jul. 6, 2016.

(51) Int. Cl.
*B32B 27/08* (2006.01)
*G21K 4/00* (2006.01)

(52) U.S. Cl.
CPC ............. *B32B 27/08* (2013.01); *G21K 4/00* (2013.01); *G21K 2004/04* (2013.01)

(58) Field of Classification Search
CPC ....... B32B 27/08; G21K 4/00; G21K 2004/04
See application file for complete search history.

(56) References Cited

U.S. PATENT DOCUMENTS

| | | |
|---|---|---|
| 5,786,600 A | 7/1998 | Lambert et al. |
| 2004/0066883 A1 | 4/2004 | Kanai et al. |
| 2010/0059681 A1 | 3/2010 | Nakamura et al. |
| 2015/0311440 A1 | 10/2015 | Seok et al. |
| 2018/0075979 A1 | 3/2018 | Jung et al. |
| 2018/0090711 A1 | 3/2018 | Gotanda et al. |
| 2018/0329080 A1 | 11/2018 | Brabec et al. |

FOREIGN PATENT DOCUMENTS

WO   2016091600 A1   6/2016

OTHER PUBLICATIONS

International Search Report in International Patent Application No. PCT/US17/40969, dated Dec. 21, 2017.
Sun et al., "Plasmonic-enhanced perovskite graphene hybrid photodetectors," Nanoscale, Feb. 5, 2016, vol. 8, pp. 7377-7383.

(Continued)

*Primary Examiner* — Blake C Riddick
(74) *Attorney, Agent, or Firm* — Gerald T. Gray; Leydig, Voit & Mayer, Ltd.

(57) ABSTRACT

Perovskite single crystal X-ray radiation detector devices including an X-ray wavelength-responsive active layer including an organolead trihalide perovskite single crystal, a substrate layer comprising an oxide, and a binding layer disposed between the active layer and the substrate layer. The binding layer including a binding molecule having a first functional group that bonds to the organolead trihalide perovskite single crystal and a second functional group that bonds with the oxide. Inclusion of the binding layer advantageously reduces device noise while retaining signal intensity.

16 Claims, 12 Drawing Sheets

(56) References Cited

OTHER PUBLICATIONS

Wei et al., "Sensitive x-ray detectors made of methylammonium lead tribromide perovskite single crystals," Nature Photonics, Mar. 21, 2016, vol. 10, pp. 333-339.
Chen et al., "Under the spotlight: The organic-inorganic hybrid halide perovskite for optoelectronic applications," Nanotoday, Jun. 9, 2015, vol. 19, pp. 355-396.
Li et al., "Multifunctional Fullerene Darivative for Interface Engineering in Perovskite Solar Cells," Journal of American Chemical Society, Nov. 23, 2015, vol. 137, pp. 15540-15547.
Aziz et al., "A facile method of achieving low surface coverage of Au nanoparticles on an indium tin oxide electrode and its application to protein detection," Chemical Communication, Aug. 4, 2008, pp. 4607-4609.
U.S. Appl. No. 16/241,071, filed Jan. 7, 2019.

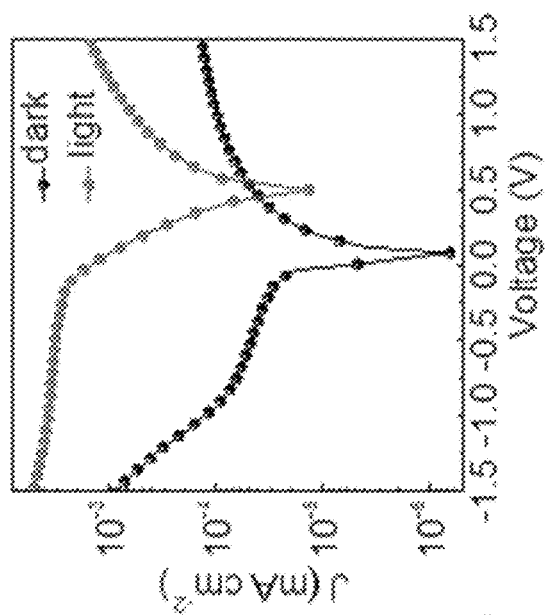
FIG. 2B
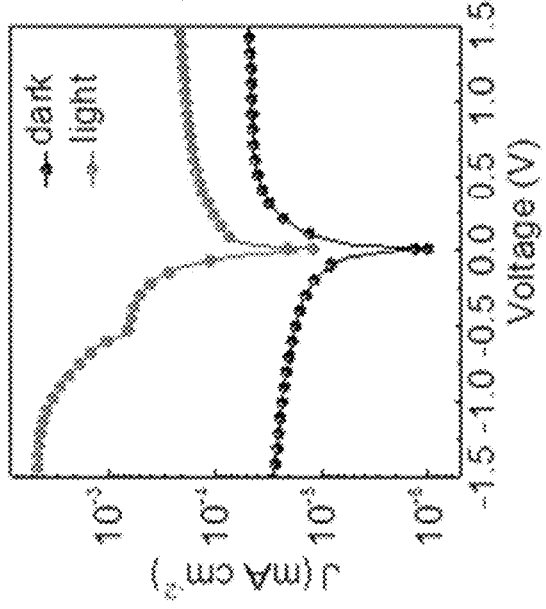
FIG. 2C
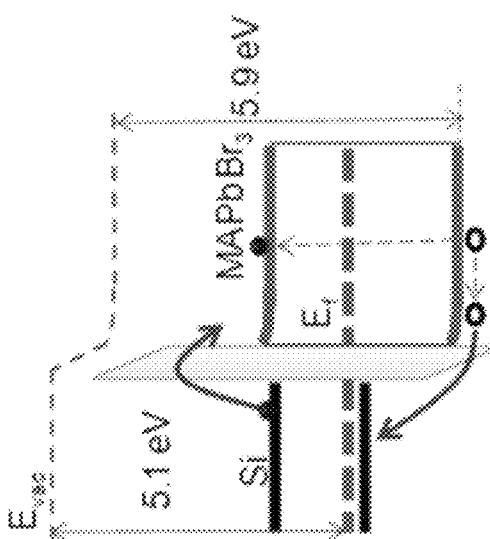
FIG. 2A
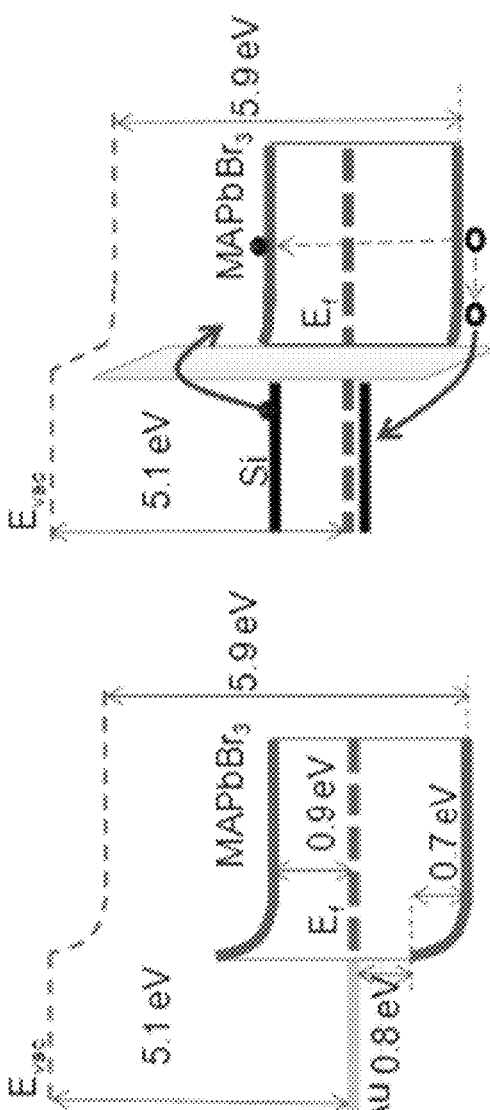
FIG. 2E
FIG. 2F
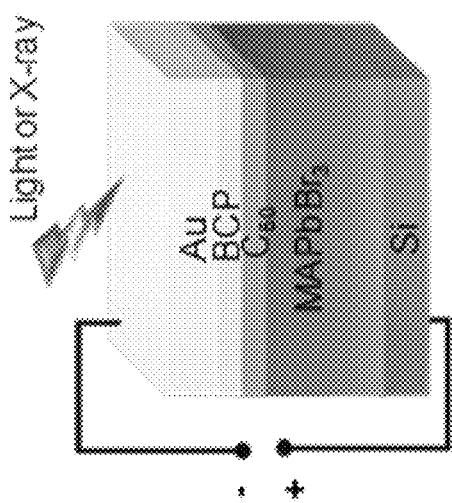
FIG. 2D

MONOLITHIC INTEGRATION OF HYBRID PEROVSKITE SINGLE CRYSTALS WITH SILICON FOR HIGHLY SENSITIVE X-RAY DETECTORS

CROSS-REFERENCE TO RELATED APPLICATIONS

This Patent Application is a divisional of U.S. patent application Ser. No. 16/241,071, filed Jan. 7, 2019, which is a continuation of PCT Application No. PCT/US2017/040969 by Huang et al., entitled "Monolithic Integration of Hybrid Perovskite Single Crystals With Silicon for Highly Sensitive X-Ray Detectors," filed Jul. 6, 2017; which claims priority to U.S. Provisional Patent Application No. 62/359,110 by Huang et al., entitled "Monolithic Integration of Hybrid Perovskite Single Crystals With Silicon for Highly Sensitive X-Ray Detectors," filed Jul. 6, 2016; each of which is incorporated herein by reference in its entirety.

FEDERALLY SPONSORED RESEARCH OR DEVELOPMENT

This invention was made with Government Support under contract no. HDTRA1-14-1-0030 awarded by the Defense Threat Reduction Agency. The Government has certain rights to the invention.

BACKGROUND

X-ray detectors are broadly applied in medical imaging, nondestructive inspection of luggage and industrial products, and scientific research. Solid-state semiconductor detectors, which directly convert X-ray photons to an electrical signal, are attractive for these applications due to their simplicity, compactness, robustness, and capability to form detector arrays for imaging. High detection efficiency, or sensitivity, and large peak-to-background ratio are generally regarded as the most important figures of merit for X-ray detectors to reduce the X-ray dose to which patients are exposed during medical check-ups and to detect weaker X-ray signals, which are closely related to the charge carrier mobility and lifetime (pi) product, as well as the atomic number (Z), of the semiconductor materials. With the rapid advances in semiconductor fabrication, various materials have been exploited for use in X-ray detectors; and most of them are crystalline materials, such as silicon (Si), germanium, cadmium zinc telluride, et al. Nevertheless, amorphous selenium (α-Se), despite its small Z and pi, has been dominating the medical X-ray imaging market due to its capability of being deposited at low temperatures onto Si thin-film transistor (TFT) arrays, which are mature technologies, to be read out in large flat panels.

Very recently, organic-inorganic hybrid perovskites (OIHPs), which have been shown to be excellent optoelectronic materials for solar cells, photodetectors, light emitting diodes, and lasers, joined the family of semiconductors used for X-ray detectors as a very promising candidate. These materials have a combination of many preferred intrinsic properties for X-ray detection, such as a proper large bandgap (Eg) of 1.6-3.0 eV to reduce thermal noise, a large pi product on the order of $10^{-4}$-$10^{-2}$ cm$^2$ V$^{-1}$ due to the small electron effective mass and extremely low trap density, high Z element of Pb in the compound, and a large density of 4.5 g/cm$^3$. The polycrystalline film devices were first demonstrated with a sensitivity of 1.1 μC $G_{air}^{-1}$ cm-2 to a low-energy X-ray of 8 keV; however, the pi product is limited, and the thin films did not have enough stopping power to absorb harder X-ray. It has been shown that the application of methylammonium lead tribromide single crystals (MAPbBr$_3$ SCs) improved pi to $1.4 \times 10^{-2}$ cm$^2$ V$^{-1}$ by removing the grain boundaries, resulting in an improved sensitivity of 80 μC $G_{air}^{-1}$ cm-2 with the lowest-detectable X-ray dose rate of 0.5 μGy$_{air}$ s$^{-1}$ (see, e.g., U.S. Provisional Application Ser. No. 62/311,291, filed Mar. 21, 2016, titled "Sensitive X-Ray Detector Devices Including Organolead Trihalide Perovskite Single Crystals," which is hereby incorporated by reference in its entirety). In addition to the good performance, the easy deposition of polycrystalline films using established solution techniques; and the simple low-temperature synthesis of single crystals gave rise to the possibility of forming a large area flat panel detector array at a low price. Notably, MAPbBr$_3$ SCs can be synthesized in solution at low temperature, which is compatible with Si technology without damage to the substrate by high temperatures. This kind of integration would be more attractive by achieving high sensitivity X-ray detectors, which provides a feasible way to meet the application requirements for medical imaging by combining the crystals with thin-film transistors to form active matrix flat-panel imagers.

SUMMARY

The monolithic integration of new electronic and optical materials with well-established inexpensive silicon circuitry opens up new applications, functionality, and simple readouts for radiation detection devices such as x-ray detector devices. In certain embodiments, detector device structures are provided that include one or more single crystals of hybrid perovskite integrated onto a silicon wafer through a facile, low-temperature, solution-processed molecular bonding. In one embodiment, a binding layer including a binding molecule is provided for bonding the perovskite active layer and a substrate layer. For example, a brominated (3-aminopropyl)triethoxysilane molecule binds silicon with native oxide and participates in the perovskite crystal with its ammonium bromide group, yielding a solid mechanical and electrical connection for devices including such a crystal. The dipole of the bonding molecule advantageously reduces device noise while retaining the signal intensity. An over tenfold reduction in dark current in such structures enables the operation of the detectors at a higher bias, resulting in a 36 times improvement in sensitivity up to 2890 μC $G_{air}^{-1}$ cm$^2$ under 50 keV X-ray radiation and a 125 times improvement in the lowest-detectable radiation level with a linear response all the way down to 4.0 nGy$_{air}$ s$^{-1}$ for the perovskite-on-silicon X-ray detectors, making such detector devices at least two orders of magnitude more sensitive than current commercial α-Se X-ray detectors.

According to an embodiment, a perovskite single crystal X-ray radiation detector device is provided that typically includes an X-ray wavelength-responsive active layer including an organolead trihalide perovskite single crystal, a substrate layer comprising an oxide, and a binding layer disposed between the active layer and the substrate layer, the binding layer including a first functional group that bonds to the organolead trihalide perovskite single crystal and a second functional group that bonds with the oxide. In certain aspects, the oxide includes SiO$_2$, TiO$_2$, ZnO, ITO, or other hydroxyl-rich oxide or metal. In certain aspects, the binding layer includes molecules having a structure of X-R1-R2, wherein R1 includes aliphatic or aromatic chains with or without side groups, and R2 includes saline or titanate groups that can hydrolyze and condense with hydroxyls on the oxide. R2 can be also aliphatic or aromatic groups, such as —$(CH_2)_nCH_3$, —$(CH_2)_nNH_2$, —$(CH_2)_nSi(OC_2H_5)_3$, —$(CH_2)_nSi(OCH_3)_3$, —$(CH_2)_nCF_3$, et. al. X can be —$NH_2$ group, sulfonic acid groups (or sulfonate groups), phosphate and carboxylate. X can be located at the end group or on the side. In one embodiment, the binding layer includes a brominated (3-aminopropyl)triethoxysilane (APTES) molecule. In certain aspects, the organolead trihalide perovskite single crystal is a perovskite single crystal having a structure of $ABX_3$, wherein A is methylammonium ($CH_3NH_3^+$), formamidium ($H_2NCHNH_2^+$), $Cs^+$, or a mixture thereof, wherein B is $Pb^{2+}$ or a mixture of $Pb^{2+}$ with $Sn^{2+}$, $Bi^{3+}/Ag^+$, or $Ge^{2+}$, and wherein X is a halide anion, thiocyanate ($SCN^+$) or a mixture thereof. In certain aspects, the organolead trihalide perovskite single crystal is a perovskite single crystal having a structure of $MAPbBr_3$, wherein MA is methylammonium ($CH_3NH_3^+$). In certain aspects, the $MAPbBr_3$ single crystal is synthesized with a ratio of $PbBr_2$:MABr around 0.6 to about 1.5 in a precursor solution. In certain aspects, a thickness of the organolead trihalide perovskite single crystal is between about 0.001 mm and about 100 mm. In certain aspects, a thickness of the organolead trihalide perovskite single crystal is between about 0.02 mm and about 5 mm. In certain aspects, the detector device further includes an electrode layer disposed on a surface of the organolead trihalide perovskite single crystal opposite the substrate layer. In certain aspects, the electrode layer comprises gold, silver, chromium, aluminum, platinum, nickel, titanium, copper or other conductive material.

In certain embodiments, processes for monolithically integrating $MAPbBr_3$ SCs onto Si substrates are provided. Such embodiments provide device structures for which the electric signal can be directly read out from Si. An $NH_3Br$-terminated molecule layer is employed in certain embodiments to electrically and mechanically connect the $MAPbBr_3$ SCs with Si without any requirements for lattice matching with the Si substrates. The Si-integrated $MAPbBr_3$ SC devices show >30 times better sensitivity and 100-fold improvement at the lowest detectable dose rate of 4.0 $nGy_{air}$ $s^{-1}$.

According to an embodiment, a method of fabricating a perovskite single crystal device structure according to various embodiments herein includes coating a substrate layer with a binding material layer to create a modified substrate surface, the binding material layer including a first functional group that bonds to an organolead trihalide perovskite structure and a second functional group that bonds with an oxide, and growing an organolead trihalide perovskite single crystal structure on the modified substrate surface.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying Figures. The use of the same reference numbers in different instances in the description and the Figures may indicate similar or identical items.

FIG. 2A is a schematic illustration of the structure of a Si-integrated $MAPbBr_3$ SC device according to an embodiment.

FIG. 2B shows dark current and photocurrent density of the Si-integrated $MAPbBr_3$ SC device of FIG. 2A. The light intensity is around $2 \times 10^{-4}$ W $cm^{-2}$.

FIG. 2C shows dark current and photocurrent density of an Au-anode $MAPbBr_3$ SC device (control device). The light intensity is around $2 \times 10^{-4}$ W $cm^{-2}$.

FIG. 2D shows KPFM images for the cross-section of the Si-integrated $MAPbBr_3$ SC.

FIG. 2E shows the energy level for the interface of Au-$MAPbBr_3$ SC.

FIG. 2F shows the energy level for the interface of Si-$MAPbBr_3$ SC with the presence of a dipole layer.

DETAILED DESCRIPTION

Integrating MAPbBr$_3$ SCs onto a Si Wafer

Figure 1A:
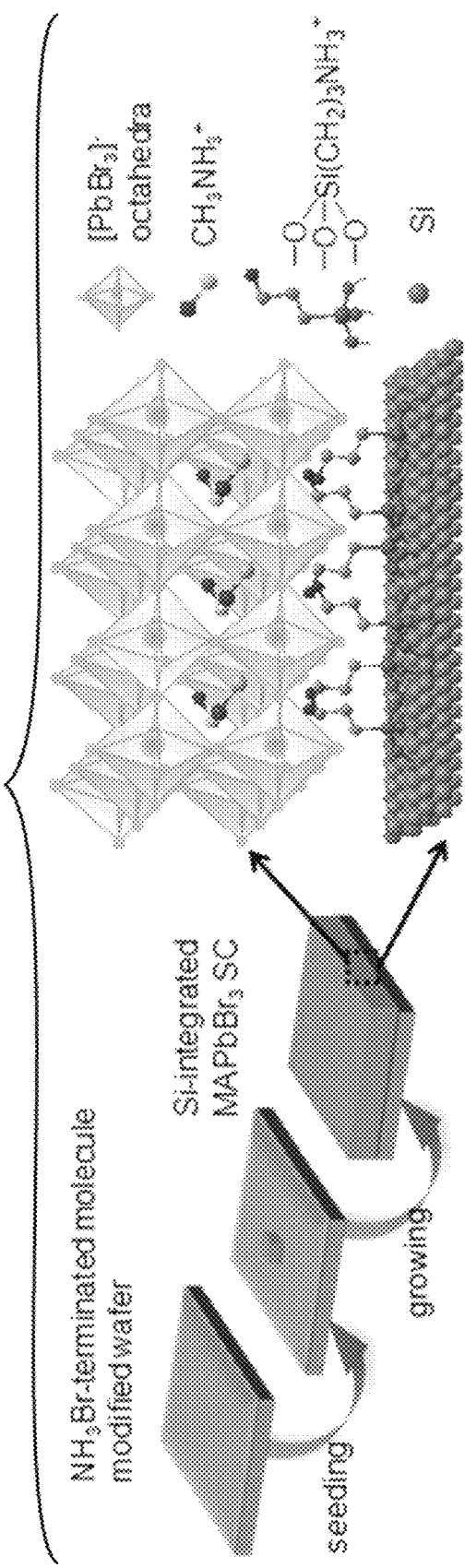
FIG. 1A shows a schematic illustration of the fabrication of Si-integrated $MAPbBr_3$ SC (not to scale; the silane thickness is highly exaggerated for clarity) according to an embodiment.

The mechanical adhesion of MAPbBr$_3$ SCs to a Si wafer is very weak if the MAPbBr$_3$ SCs are directly grown on Si, due to weak bonds, such as hydrogen bonds, and van der Waals interactions. To address this issue, in certain embodiments, a layer including a binding molecule is added to connect the perovskite and the substrate by forming primary chemical bonds. In certain embodiments, a binding layer is disposed between the active layer and the substrate layer, where the binding layer includes a first functional group that bonds to the perovskite single crystal and a second functional group that bonds with oxide in the substrate. For example, in one specific embodiment, a layer including brominated (3-aminopropyl)triethoxysilane (APTES), whose chemical structure is shown in FIG. 1A, is added to connect the perovskite and Si by forming primary chemical bonds. FIG. 1A provides a schematic of the low temperature, solution-processed, molecular bonding procedure for a Si-integrated MAPbBr$_3$ SC. Highly reactive Si—OH groups are generated by the hydrolysis of Si—O—C$_2$H$_5$ groups on an APTES molecule, which can bond with the —OH on the Si wafer via a condensation process to form strong covalent Si—O—Si bonds and obtain NH$_2$-terminated molecular layers on the Si wafer. The basic—NH$_2$ groups can react with hydrobromide to form—NH$_3$Br salt, which participates in the formation of perovskite by reacting with the PbBr$_2$. The [—Si(CH$_2$)$_3$NH$_3$]$^+$ binds [PbBr$_3$]— by ionic bonds on the surface of a MAPbBr$_3$ SC close to a Si wafer, as shown in the diagram in FIG. 1A. The brominated APTES layer performs as a bridge so that it naturally bonds Si with MAPbBr$_3$ crystals.

A modified reverse-solubility method may be used to grow MAPbBr$_3$ SCs on a Si wafer as described in Saidaminov, M. I. et al. High-quality bulk hybrid perovskite single crystals within minutes by inverse temperature crystallization. Nat Commun. 6, 7586 (2015). A pre-seeded MAPbBr$_3$ SC with a size of <300 μm was placed onto the NH$_3$Br-terminated molecules modified wafer and grown to a thickness of 2-3 mm, which is thick enough to absorb most of the X-ray energy below 50 keV, by keeping the Si wafer in the MAPbBr$_3$/DMF solution at 70° C. for 6-8 hours.

Figure 1D:
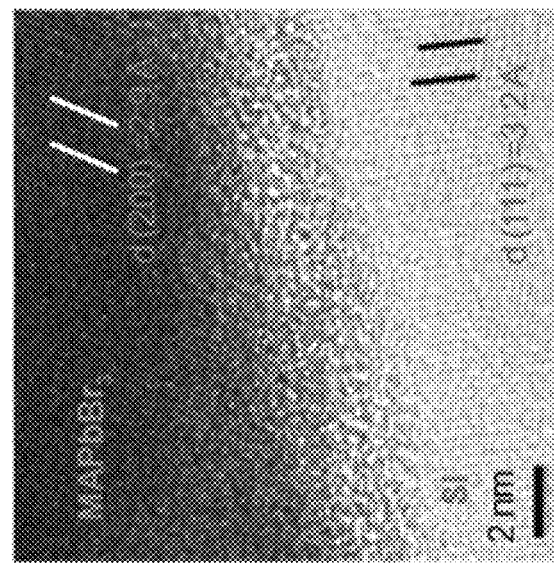
FIG. 1D shows a high-resolution TEM image of the cross-section of the interface of Si-integrated $MAPbBr_3$ SC where Si lattice and $MAPbBr_3$ lattice are labeled.
Figure 1C:
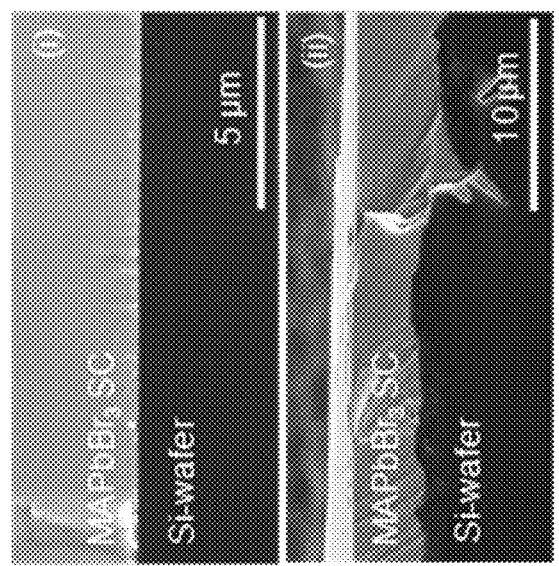
FIG. 1C shows SEM images of the cross-section of $MAPbBr_3$ SC grown on a flat Si wafer (i) and rough Si wafer (ii), respectively.
Figure 1B:
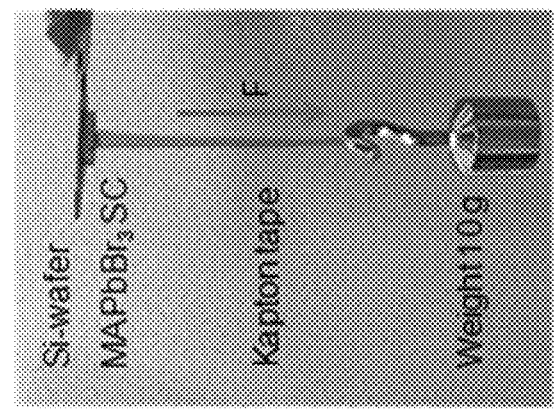
FIG. 1B is a photograph of the Si-integrated $MAPbBr_3$ SC with a 10 g weight attached on the $MAPbBr_3$ crystal by Kapton tape.
Figures 5A, 5B:
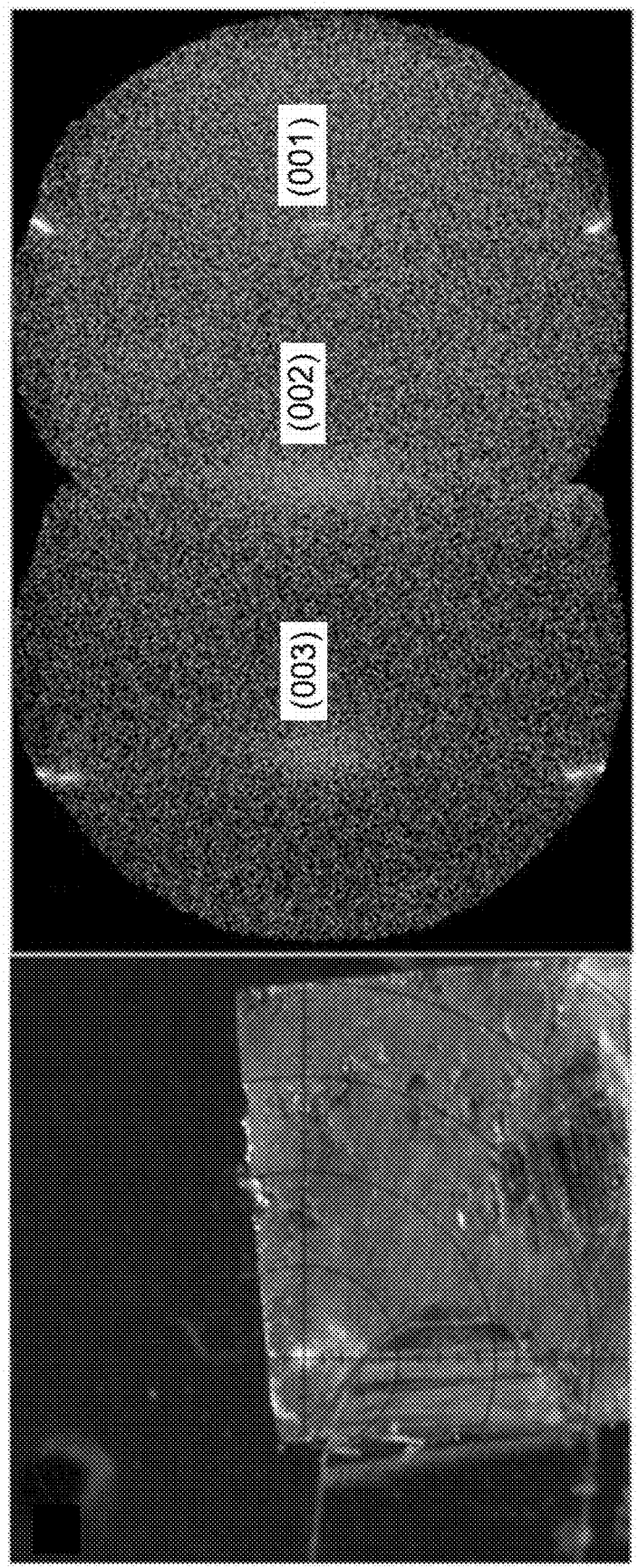
FIG. 5A shows a microscopic image of a single crystal; the X-ray beam is located at the front face of the crystal, which is the surface of $MAPbBr_3$ SC peeled off from the rough Si wafer; the single crystal shows an uneven fracture layer, due to the strong adhesion between the crystal and the peeled wafer.
FIG. 5B shows two-dimensional XRD for the surface of $MAPbBr_3$ SC peeled off from the Si wafer; a diffraction pattern of isolated spots caused by X-ray diffraction from oriented lattice planes was observed without continuous arcs (Debye ring), which is consistent with high quality single crystals.

Due to the chemical bonds formed at the interface, the single crystals grown on the functionalized Si wafers have a solid mechanical and electrical connection between Si and the perovskite crystals. FIG. 1B shows the mechanical contact test for the Si-integrated SC. It is observed that the MAPbBr$_3$ SC, with an area of 5.8 mm×5.8 mm, integrated onto the Si wafer could bear its own gravity plus an added weight of 10 g, which corresponds to a tensile pressure of 3.5 kPa. In certain embodiments, the perovskite crystals can be grown on roughened Si wafers, e.g., formed by scratching the wafers with sandpaper. The cross-section scanning electron microscope (SEM) images, shown in FIG. 1C, show the interfacial morphology of MAPbBr$_3$ SC growing on the flat and sandpaper-scratched Si wafers, which reveals successful integration of MAPbBr$_3$ with Si in both cases. For the MAPbBr$_3$ grown on a rough Si wafer, the SCs closely fit with the substrates with the same orientation (FIG. 5), which increased the contact area between the wafer and SC and thus resulted in better mechanical adhesion of MAPbBr$_3$ SCs and Si wafers without compromising the electric properties, as shown below. The high-resolution transmission electron microscopy (TEM) image (FIG. 1D) of the Si-MAPbBr$_3$ interface revealed a 2-3 nm thick amorphous region between the crystalline lattices of Si and MAPbBr$_3$, which can be assigned to be native SiO$_2$, a brominated APTES molecule layer (~1 nm thick) in between, and some amorphous MAPbBr$_3$ close to the MAPbBr$_3$SC side.

Figure 6:
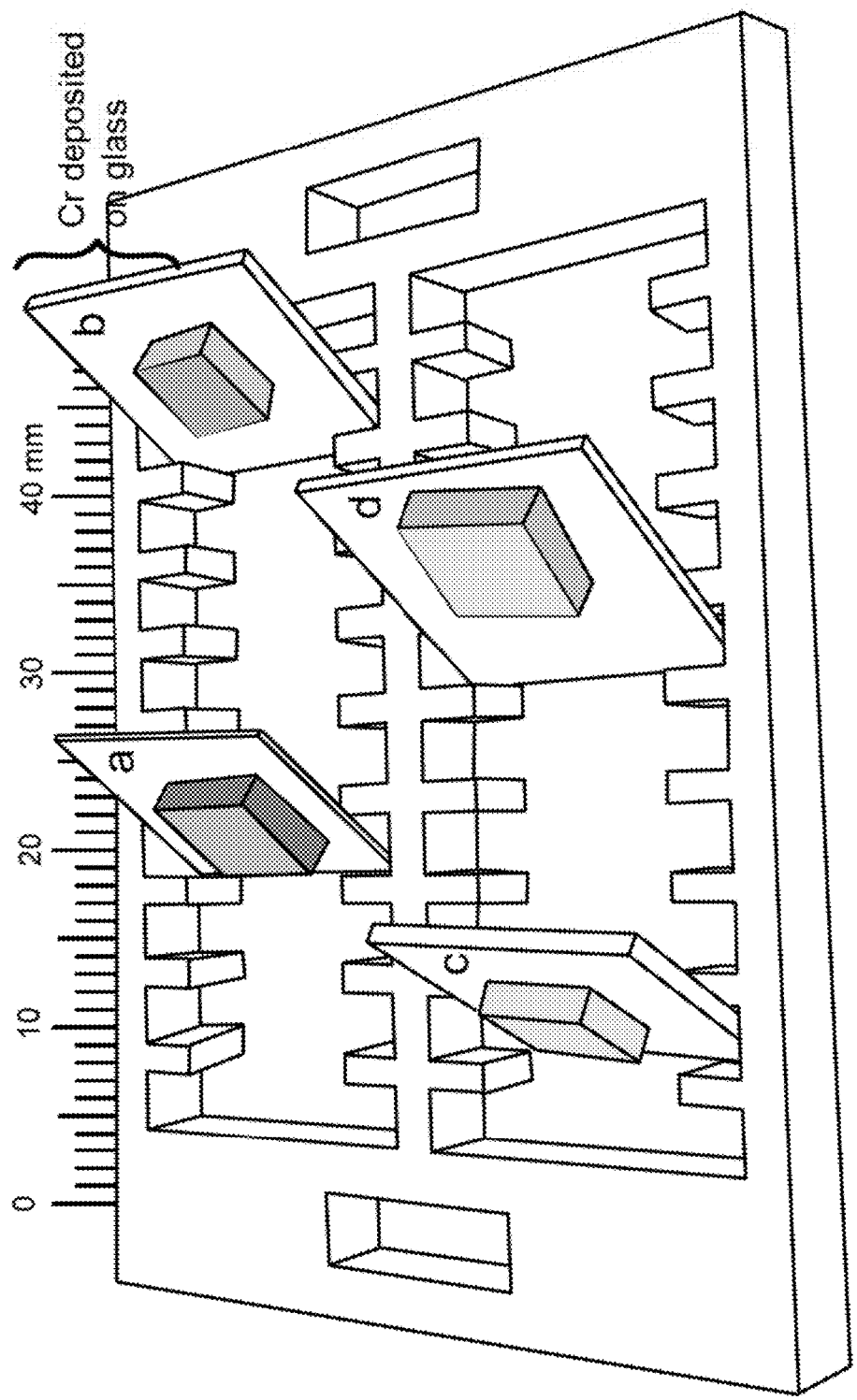
FIG. 6 shows images of MAPbBr$_3$ SCs integrated on various substrates: a) Si-wafer (the top surface is covered by Au); b) Metal, chromium (Cr); c) Quartz; and d) Indium tin oxide (ITO) glass (the top surface is covered by Au).

Of note is the automatic transition of MAPbBr$_3$ material growth from the amorphous to crystalline phases despite the absence of a lattice match between Si and MAPbBr$_3$. This can be explained by the small critical thickness in the perovskite layer to relaxation of the strain caused by the lattice mismatch and at least one order of magnitude smaller Young's modulus of the hybrid perovskite than those of most regular inorganic semiconductors, such as GaN, Si, GaAs et al. The results indicate that the perovskite crystals can be eventually grown on any substrate that can bond to APTES molecules. To verify this, MAPbBr$_3$ SCs were grown on many surfaces that are needed for different types of device integration, such as indium tin oxide (ITO) or other types of oxides, metals, and even glass, as shown by the images in FIG. 6. Although the perfect lattice-matched system of perovskite-lead sulfide quantum dots (PbS QDs) was shown to passivate the PbS QDs and enhance their optoelectronic properties, the relief of the lattice matching constrain enables integration of perovskite materials heterogeneously with many other electronic and optical materials and substrates, thus opening up much broader fields for the application of perovskite materials.

Devices and Optoelectronic Properties of the Perovskite/Si Interfaces

In certain embodiments, photoactive devices have a structure as shown in FIG. 2A of electrode (anode or cathode) 10/perovskite-SC 20/electrode (cathode or anode) 30, where the two electrodes (10, 30) are on opposite sides of the perovskite-SC as shown in FIG. 2A. In these embodiments, the perovskite-SC is the photoactive layer and responsive to a wide range of wavelengths, including for example x-ray wavelengths, and photoresponsive charges (and holes) generated in the photoactive layer generally migrate to the electrodes in a vertical fashion as shown by the arrow in FIG. 2A. In other embodiments, photoactive devices have a structure of electrode (anode or cathode) 10/perovskite-SC 20/electrode (cathode or anode) 30, where the two electrodes (10, 30) are on the same side of the perovskite-SC (not shown). In these embodiments, the perovskite-SC is the photoactive layer and responsive to a wide range of wavelengths, including for example x-ray wavelengths, and photoresponsive charges (and holes) generated in the photoactive layer generally migrate to the electrodes in a lateral fashion along the plane defined by the perovskite-SC. A lateral structure may also be formed by positioning electrode 30 on an opposite side of the perovskite-SC 20 from electrode 10, but displaced laterally along the perovskite-SC layer.

In certain embodiments, the perovskite-SC includes a perovskite single crystal having a structure of $ABX_3$, wherein A is methylammonium ($CH_3NH_3^+$), $Cs^+$, formamidinum ($H_2NCHNH_2^+$), $Rb^+$ or a mixture thereof, B is $Pb^{2+}$ which can be partially or completely replaced by other ions such as $Bi^{3+}$, $Sb^{3+}$, $Sn^{2+}$ or a mixture thereof. The A, B and X ions are not limited to those above mentioned ions, but rather may comprise any ions whose ionic radius are suitable to form a stable perovskite structure. Methylammonium ($CH_3NH_{3+}$) may also be referred to herein as "MA". One specific example is or $MAPbBr_3$. Other material layers such as hole accepting/transport material layers and/or electron accepting/transport material layers may be included between the electrode layers and the active layer (e.g., perovskite-SC) as desired.

Useful cathode materials (and/or anode materials) include any transparent or semi-transparent conductive or semi-conductive material, such as metals or metal films, conductive polymers, carbon nanotubes, graphene, organic or inorganic transparent conducting films (TCFs), transparent conducting oxides (TCOs), etc. Specific examples of cathode materials include gallium (Ga), gold (Au), silver (Ag), tin titanium (Ti), indium tin oxide (ITO), indium (In), copper (Cu), carbon nanotubes, graphene, aluminum (Al), chromium (Cr), lead (Pb), platinum (Pt), and PEDOT:PSS. The dimensions of the cathode layer may be varied depending on the material used. For example, the cathode may have a thickness of between about 10 nm and about 100 nm or greater (e.g., less than about 200 nm, or less than about 1000 nm, or less than about 1 µm, or less than about 1 mm, or less than about 1 cm), depending on the conductivity of the materials used. Known deposition or thermal evaporation techniques may be used to form the cathode layer. A substrate, upon which an anode layer or a cathode layer may be formed, may be used to provide structural stability and may include glass, polymer, semiconductor materials, etc.

Figure 7:
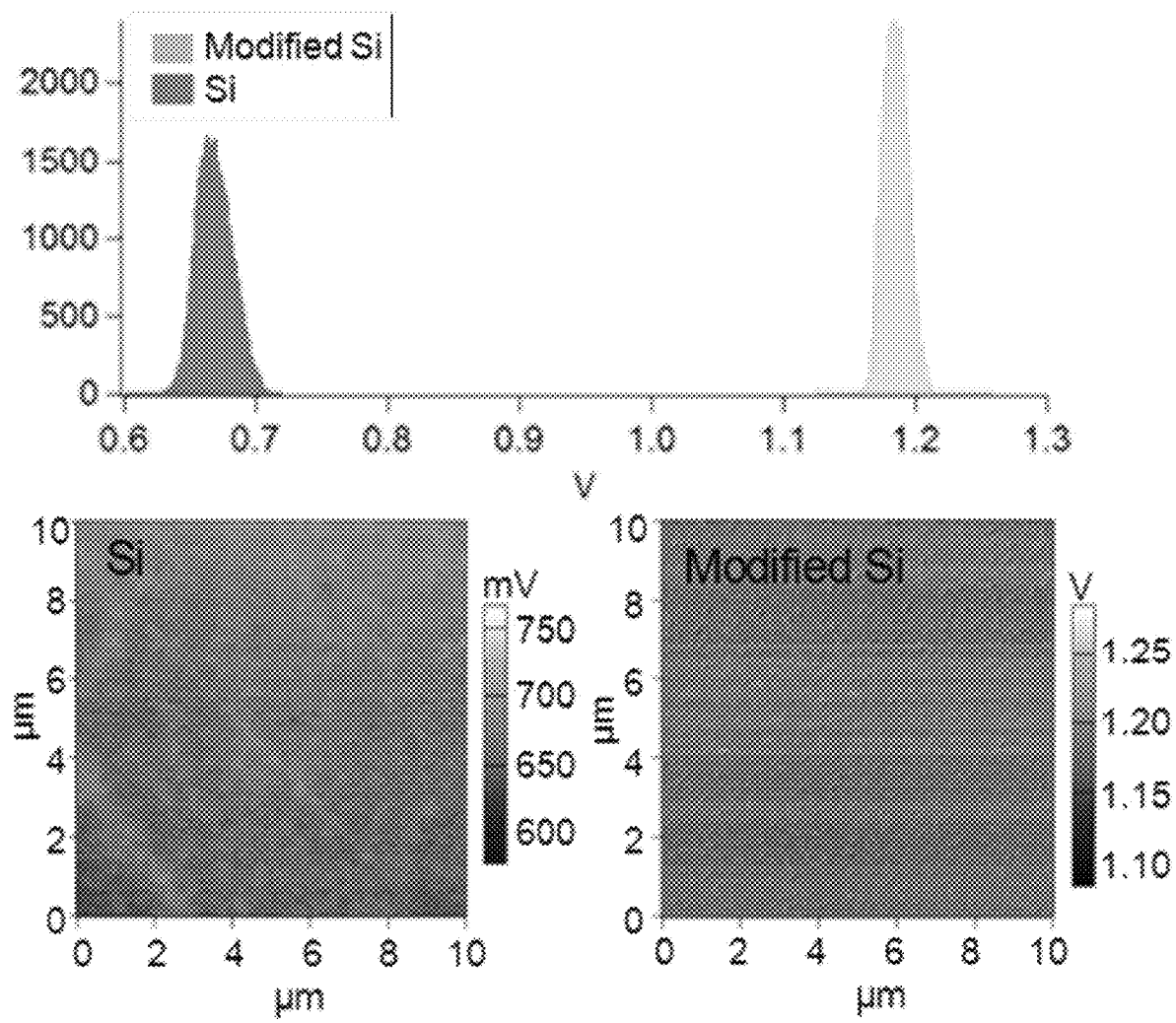
FIG. 7 shows KPFM of the Si-wafer before and after modified with NH$_3$Br-terminated molecules.

One specific device structure embodiment as shown in FIG. 2A was constructed to characterize the electronic properties of the $Si/MAPbBr_3$ interface. In this embodiment, the cathode 10 includes layers of C60 (e.g., 20 nm), BCP (e.g., 8 nm), and Au (e.g., 25 nm) which may be sequentially deposited on the other side of the $MAPbBr_3$ SCs relative to Si working as an anode. Radiation/light impinges from the translucent Au side. For comparison, a device was fabricated with Au as an anode by following previous procedures (see, U.S. Provisional Application Ser. No. 62/311,291, filed Mar. 21, 2016, titled "Sensitive X-Ray Detector Devices Including Organolead Trihalide Perovskite Single Crystals" which is incorporated by reference) and used as a control device (referred to as a Au-anode $MAPbBr_3$ SC device hereafter). Nevertheless, a substantial difference in optoelectronic properties was observed. The symmetrical dark current under forward and reverse bias and the absence of a notable photovoltage for the device under illumination shown in FIG. 3B indicated that the contact of $Si/MAPbBr_3$ is ohmic. This is in strong contrast to the Schottky junction of $Au/MAPbBr_3$ contacts. In order to understand the interface energy levels, Kelvin probe force microscopy (KPFM) was used to scan the potential profile of the cross-section of $Si/MAPbBr_3$ interface. The cross-section was obtained by direct cutting without resorting to focused ion beam (FIB) so that it was not contaminated, and the cross-section was smooth enough for KPFM measurement. As shown in FIG. 2D, there was an abrupt potential change at the $Si/MAPbBr_3$ interface by 0.5-0.6 eV. It can be speculated that this was caused by the dipole moment of the brominated APTES molecule. To verify, the surface potential of a bare Si and an $NH_3Br$-terminated molecule-covered Si was measured and the same work-function shift observed (FIG. 7). The energy diagram can be sketched at the $Au/MAPbBr_3$ and $Si/MAPbBr_3$ interfaces based on the energy levels of $MAPbBr_3$ reported. As shown in FIG. 2E, there was a Schottky junction formed at the $Au/MAPbBr_3$ interface with a band bending of 0.7 eV to align the Fermi level of Au and $MAPbBr_3$, while the shift of the vacuum level by the brominated APTES dipoles aligned the Fermi level of Si and $MAPbBr_3$ and thus results in the formation of the rectifying less contact.

The dipole layer with a large energy barrier for electron injection but small energy barrier for hole extraction yielded a small dark current and a large photocurrent of the Si-integrated $MAPbBr_3$ SC device. The dark current density ($J_d$) was 3-30 times lower than the control device (Au-anode $MAPbBr_3$ SC device) under the same reverse bias (FIG. 2B-C) with stronger dark current suppression at higher bias. The $J_d$ of 23 nA cm-2 at −1 V bias of the Si-integrated device was even smaller than that of the control device at −0.1 V bias. This allowed the operation of the devices as light and X-ray detector at ten times higher bias to enhance signal output. The inserted dipole layer did not sacrifice the photocurrent. The Si-integrated $MAPbBr_3$ SC device had the same value of photocurrent compared to the control device under −1 V bias.

Figure 3A:
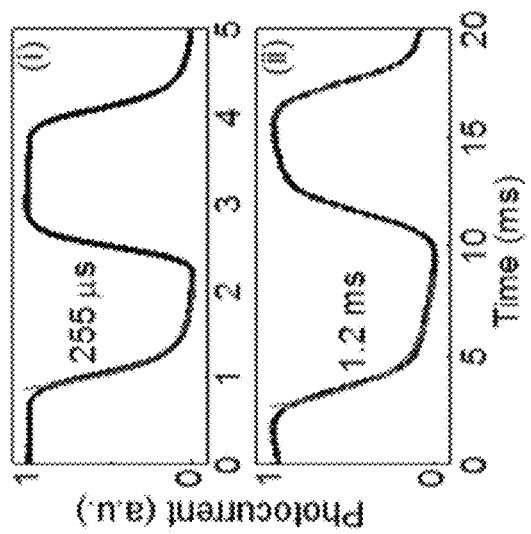
FIG. 3A shows EQE and IQE of an Si-integrated $MAPbBr_3$ SC device at different bias.
Figure 3B:
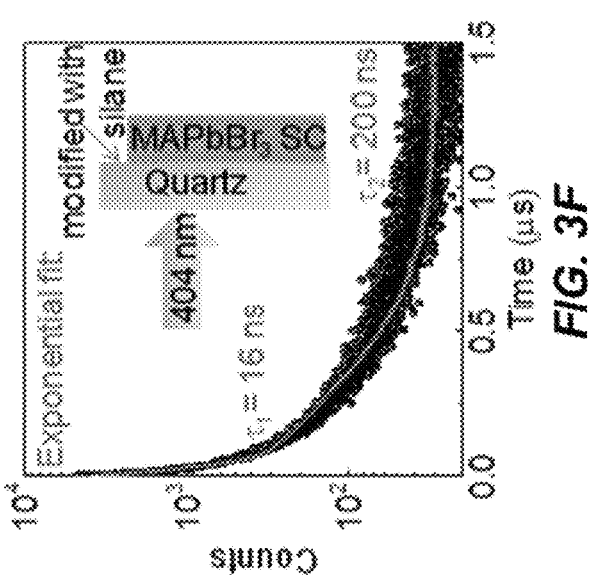
FIG. 3B shows photocurrent density versus the light intensity for the Si-integrated $MAPbBr_3$ SC device under −1.0 V bias, and the Au-anode $MAPbBr_3$ SC device (control device) at −0.1 V bias; the responsivity (R) derived from the slope of the inset curves was 0.02 A $W^{-1}$ and 0.01 A $W^{-1}$, respectively.
Figure 3C:
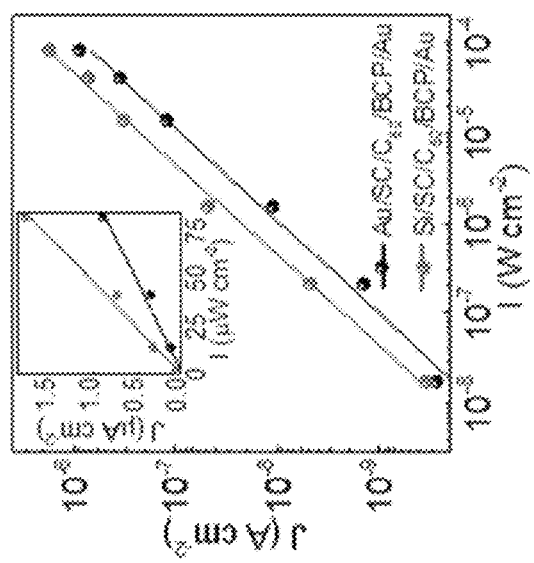
FIG. 3C shows temporal response of the Si-integrated $MAPbBr_3$ SC device at −1.0 V bias (i), and the Au-anode $MAPbBr_3$ SC device (control device) at −0.1 V bias (ii); the thickness of the $MAPbBr_3$ SCs used in these devices was 2.2 mm.
Figure 8A:
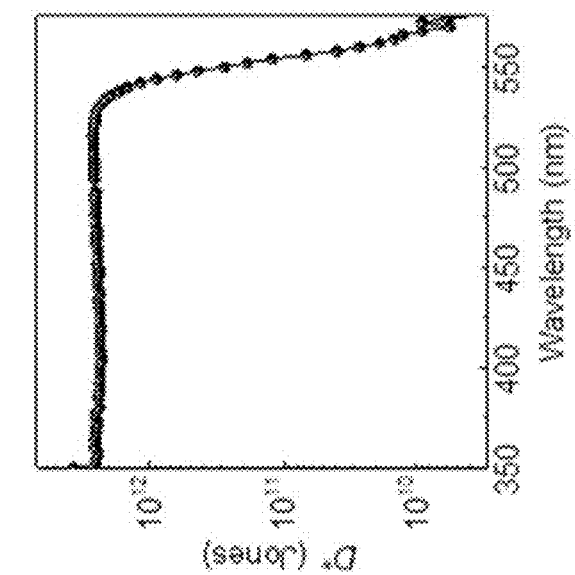
FIG. 8A shows the noise current at different frequencies for the Si-integrated MAPbBr$_3$ SC device under −1 V bias.
Figure 8B:
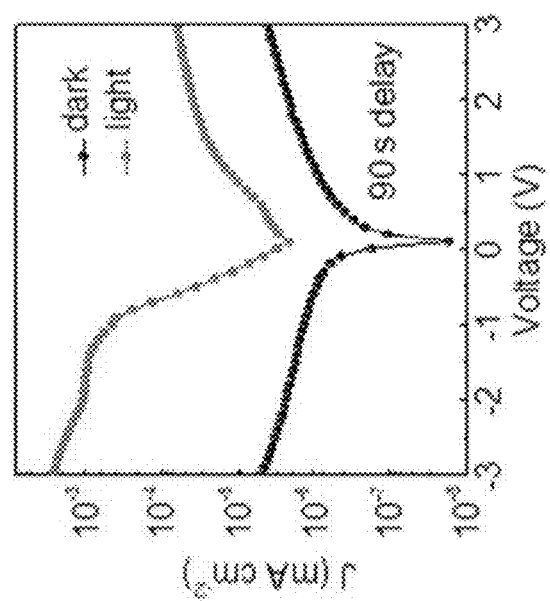
FIG. 8B shows 90s stabilized dark current and photocurrent density of the Si-integrated MAPbBr$_3$ SC device.
Figure 8C:
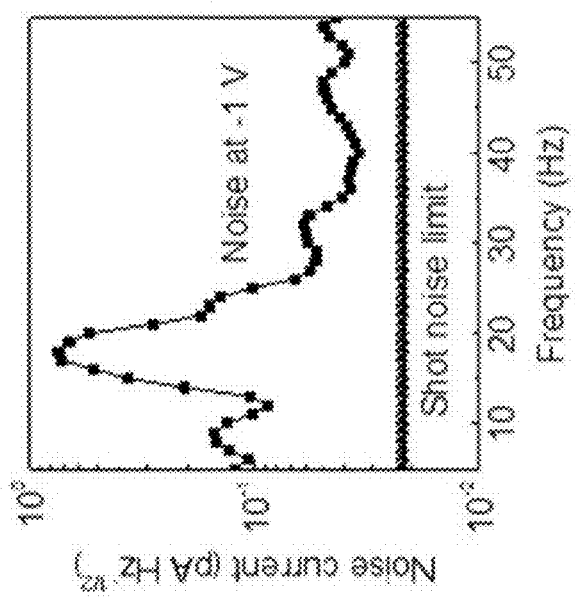
FIG. 8C shows specific detectivity of a MAPbBr$_3$ SC device calculated by IQE and NEP.

The small dark current and large photocurrent of the Si-integrated device enabled sensitive light and X-ray detection. The visible light detection properties of the Si-integrated $MAPbBr_3$ SC devices were evaluated. The external quantum efficiency (EQE) measurement in FIG. 3A shows that the Si-integrated $MAPbBr_3$ SC device possessed 70% average internal quantum efficiency (IQE) with a maximum value around 90% under −1 V bias; and IQE increased slightly with increased bias to −2 V and then saturated. The close unity IQE indicates a nearly 100% charge collection efficiency of the Si-integrated $MAPbBr_3$ SC device, which is about a two-fold improvement of the Au-anode $MAPbBr_3$ SC device. FIG. 3B shows the photocurrent response of the Si-integrated $MAPbBr_3$ SC device and the control device under the irradiance of a 390 nm LED. The responsivity (R) of the Si-integrated device at −1 V bias was also two times higher than that of the control device, agreeing with the doubled IQE of the Si-integrated device. The Si-integrated $MAPbBr_3$ device showed a low noise current of 0.05 pA Hz⁻1/2 under −1 V bias at 35 Hz (FIG. 8A) that was independent of the frequency and close to the calculated shot noise limit from the dark current (FIG. 8B). To maintain the low noise, the devices were operated at −1 V for light and X-ray detection. A maximum specific detectivity (D*) of $2 \times 10^{12}$ cm $Hz^{1/2}$ $W^{-1}$ (Jones) was derived from IQE and the noise current (FIG. 8C). The response time in FIG. 3C was derived from the decay process of the photocurrent curve measured with a chopper under low excitation intensity of several microwatts per square centimeter (µW cm−2). The Si-integrated device showed a rapid response time of 255 µs under −1 V bias, which is five times faster than that of the control device under −0.1 V bias. The less than 10 times enhancement can be explained by the existence of a built-in field in the control device.

Figure 3E:
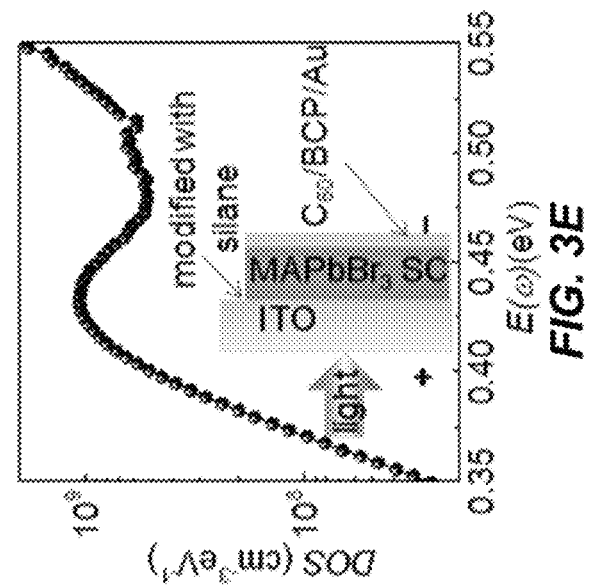
FIG. 3E shows t-DOS of the $MAPbBr_3$ SC integrated on $NH_3Br$-terminated molecules modified ITO glass.
Figure 3D:
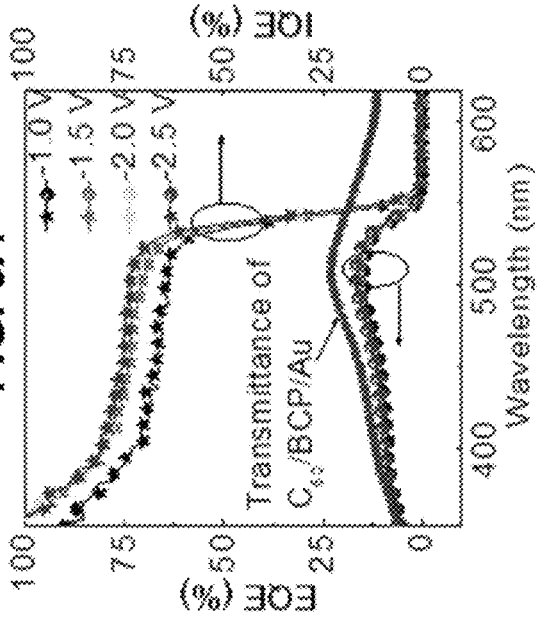
FIG. 3D shows the normalized transient current curves of the Si-integrated $MAPbBr_3$ SC device under various biases; the inset shows the charge transit time versus the reciprocal of bias; the solid line is a linear fit to the data.
Figure 3F:
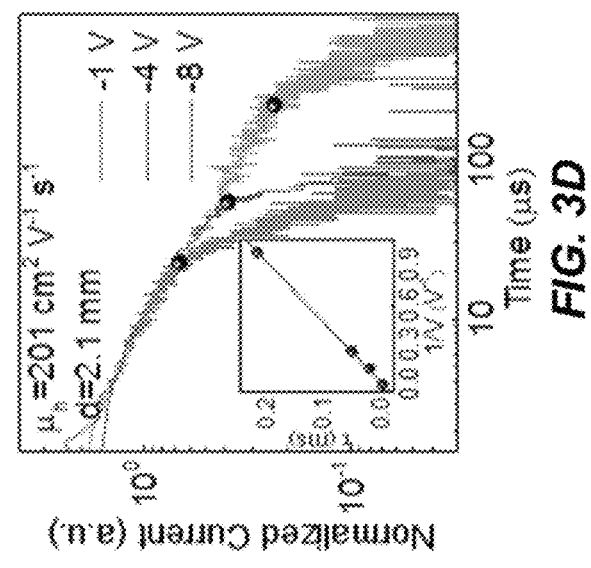
FIG. 3F shows the PL surface recombination lifetime of the $MAPbBr_3$ SC growing on $NH_3Br$-terminated molecules modified quartz.

The transport properties of MAPbBr$_3$ SCs grown on Si were essentially the same as those grown in solution, as evidenced by the same carrier mobility of 201 cm2 V$^{-1}$ s$^{-1}$ measured by time of flight (ToF) (FIG. 3D). The device response time of ~230 μs under −1 V can also be derived from the ToF signal decay curve, which was consistent with the response time measurement result shown in FIG. 3C. In order to study the optoelectronic property of the interfacial connection layer, the MAPbBr$_3$ SC was integrated onto the ITO glass so that light could come directly to this interfacial layer through transparent ITO glass, as shown in FIG. 3E. The trap density of the crystal close to the NH$_3$Br-terminated molecules modified ITO, as measured by impedance spectroscopy, showed a comparable value of $10^8$-$10^9$ cm$^{-3}$ eV$^{-1}$ with that of the Au-anode MAPbBr$_3$ SC device. The surface charge recombination rate was exploited by a PL lifetime measurement of a quartz-integrated MAPbBr$_3$ SC. Incident laser (404 nm) penetrated the quartz without attenuation and was absorbed by the very thin surface layer of the crystal closed to the brominated APTES molecular layer due to the small penetration length of 180 nm for 404 nm light in MAPbBr$_3$. The measured charge recombination lifetime should represent the charge recombination process at the surface combining the diffusion of carrier away from the crystal surface. A short lifetime of 16 ns and a long lifetime of 200 ns were derived from the fitting curve in FIG. 3F, which can be assigned to the surface recombination and bulk recombination, respectively. It was previously shown that passivating the MAPbBr$_3$ surface by ozone treatment could eliminate the surface recombination and thus the short lifetime part. But this short lifetime component also exists for PL decay from other facets of the same crystals without surface passivation. This comparable trap density, as well as the charge recombination lifetime, indicate that the very thin amorphous perovskite layer at the silicon/perovskite interface did not cause additional trap states or additional charge quenching sites, which can be explained by the unique defect-tolerant nature of the hybrid perovskite predicted by theoretical calculation (Yin, W.-J., Shi, T. & Yan, Y. Unusual defect physics in CH$_3$NH$_3$PbI$_3$ perovskite solar cell absorber. Applied Physics Letters 104, 063903 (2014)). It should be noted that the surface recombination lifetime of 16 ns should not cause loss of photon-generated charges because the charge transit time through the 3 nm thick surface was much less than 16 ns due to the very large mobility of MAPbBr$_3$.

Si-Integrated MAPbBr$_3$ SC X-Ray Detectors

Figure 4B:
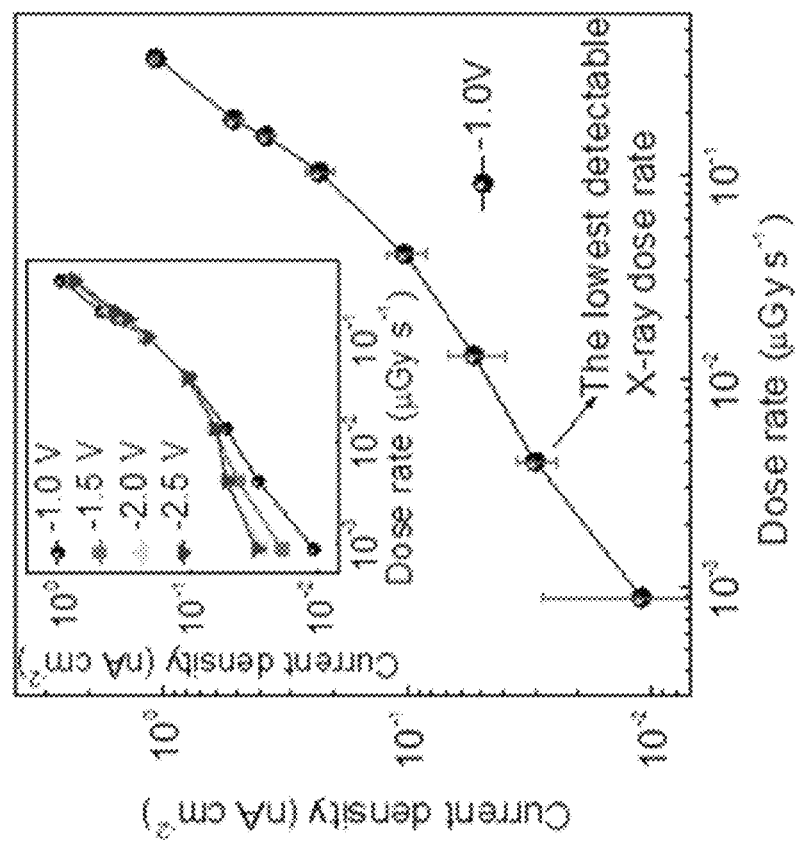
FIG. 4B shows X-ray generated photocurrent at various dose rates all the way down to the lowest-detectable dose rate at −1 V bias; the inset shows the X-ray generated photocurrent at various dose rates at different biases; the absolute value of current density is used in the logarithmic axis.
Figure 4A:
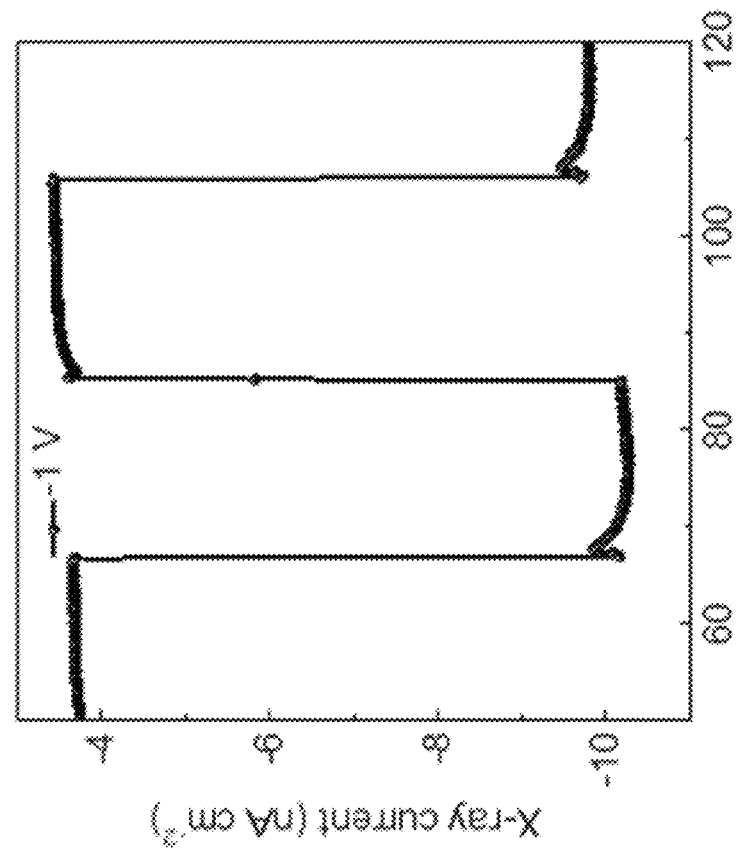
FIG. 4A shows Si-integrated $MAPbBr_3$ SC device response to X-rays by turning on/off the X-ray source.
Figure 9:
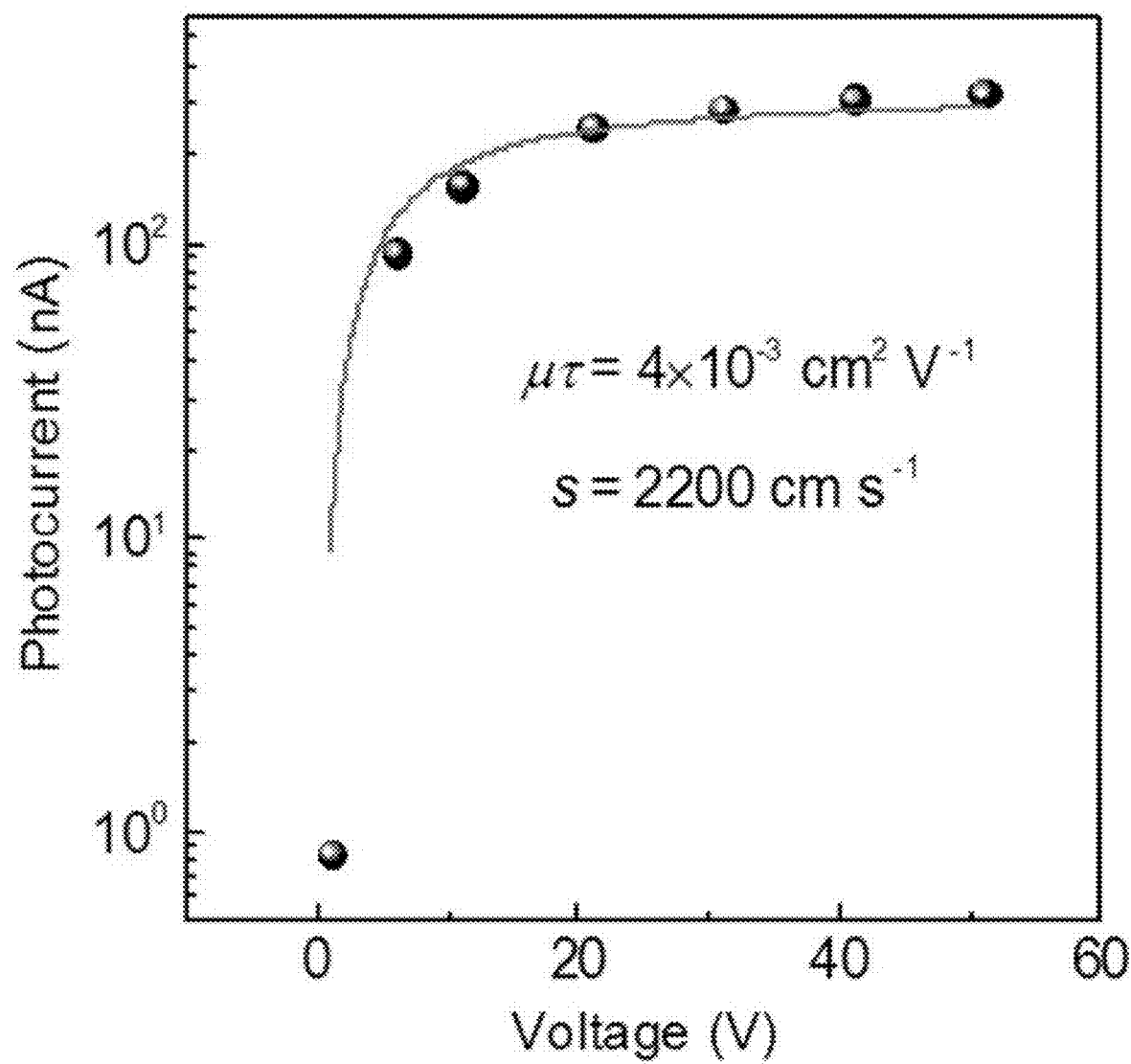
FIG. 9 shows photoconductivity of a Si-integrated MAPbBr$_3$ SC device.

The mobility-lifetime (μτ) product of the MAPbBr$_3$ SC was comparable to those best grown in solution without Si integration, as confirmed by the photoconductivity measurement shown in FIG. 9. Due to the excellent charge collection efficiency and strong stopping power of the MAPbBr$_3$ SCs, the 2.0 mm-thick Si-integrated MAPbBr$_3$ SC device showed a sensitive response to the X-rays by turning on and off the incident X-ray, as shown in FIG. 4A. In order to evaluate the sensitivity and lowest-detectable dose rate of the Si-integrated MAPbBr$_3$ SC detectors, the total X-ray dose was controlled by changing the current of the X-ray tube, with the detection geometry shown in FIG. 10. The current signal of the Si-integrated MAPbBr$_3$SC device under different bias was recorded by a lock-in amplifier at the same frequency as the chopped X-ray. The sensitivity of the detector was derived from the slope of the device output current density versus X-ray dose rate, as shown in FIG. 4B. A dramatically enhanced sensitivity of 2890 μC $G_{air}^{-1}$ cm$^{-2}$ at −1 V bias was obtained, which is 36 times higher than the sensitivity achieved with the Au-anode MAPbBr$_3$ SC X-ray detectors (80 μC $G_{air}^{-1}$ cm$^{-2}$ at −0.1 V bias) and more than 150-fold larger than that of the α-Se X-ray detectors. The enhanced sensitivity can be explained by the twofold enhancement of internal quantum efficiency observed as well as the ten-times larger bias applied as compared to the previous detectors, which again highlighted the significance of the reduced noise current of the detectors. The low noise current of the Si-integrated devices also gave rise to a reduction of the lowest-detectable X-ray dose rate and thus improved sensitivity to a weaker X-ray dose. The current-signal generated from the device by the X-ray with a dose rate of 4.0 nGyair s$^{-1}$ was easily distinguished from the noise with good fidelity, which represented a 125-fold improvement over the Au-anode MAPbBr$_3$ SC device achieved at −0.1 V bias. Meanwhile, the inset in FIG. 4B shows the device output current under different bias, showing that the sensitivity remained invariant as the bias was increased from −1 V to −2.5 V, which agreed with the almost constant charge extraction efficiency (IQE shown in FIG. 3A) under different bias. The lowest-detectable X-ray dose, however, deteriorated under higher bias, most likely caused by the increasing leakage current (FIG. 8C). A moderate bias of −1 V was thus optimal for achieving both high sensitivity and a low X-ray dose limit. Eventually, the theoretical lowest-detectable X-ray dose could be reached by further reducing the dark current to when quantum noise dominates, in which case one may use the concept of detection limits by merely measuring the background radiation to deduce the lowest-detectable dose.

Si-integrated SC, e.g., MAPbBr$_3$ SC, devices prepared via a low-temperature solution-processed molecular bonding method with an inserted layer of brominated APTES molecules resulted in a significant reduction of dark current at higher bias, which is impressive for the Si-integrated SC detectors to sense a very low X-ray dose rate of 4.0 nGy$_{air}$ s$^{-1}$ with high sensitivity of 2890 μC $G_{air}^{-1}$ cm$^{-2}$. These performances were several orders of magnitude better than the state-of-the-art commercial (—Se X-ray detectors, paving the way for the commercialization of perovskite X-ray detectors for medical and security check applications, so that the X-rays to patients and passengers can be dramatically reduced. The relative low bias of −1 V allows the operation of such detectors to be powered by portable batteries. The methods described herein are low-cost, scalable, and enable integration of X-ray detectors with readout silicon circuits. In addition, these methods provide a facile way to integrate the perovskite SCs, e.g., MAPbBr$_3$ SCs, onto various generally used substrates at low temperatures in solution, which opens a new avenue for the application of perovskite materials in much broader fields.

Figure 11:
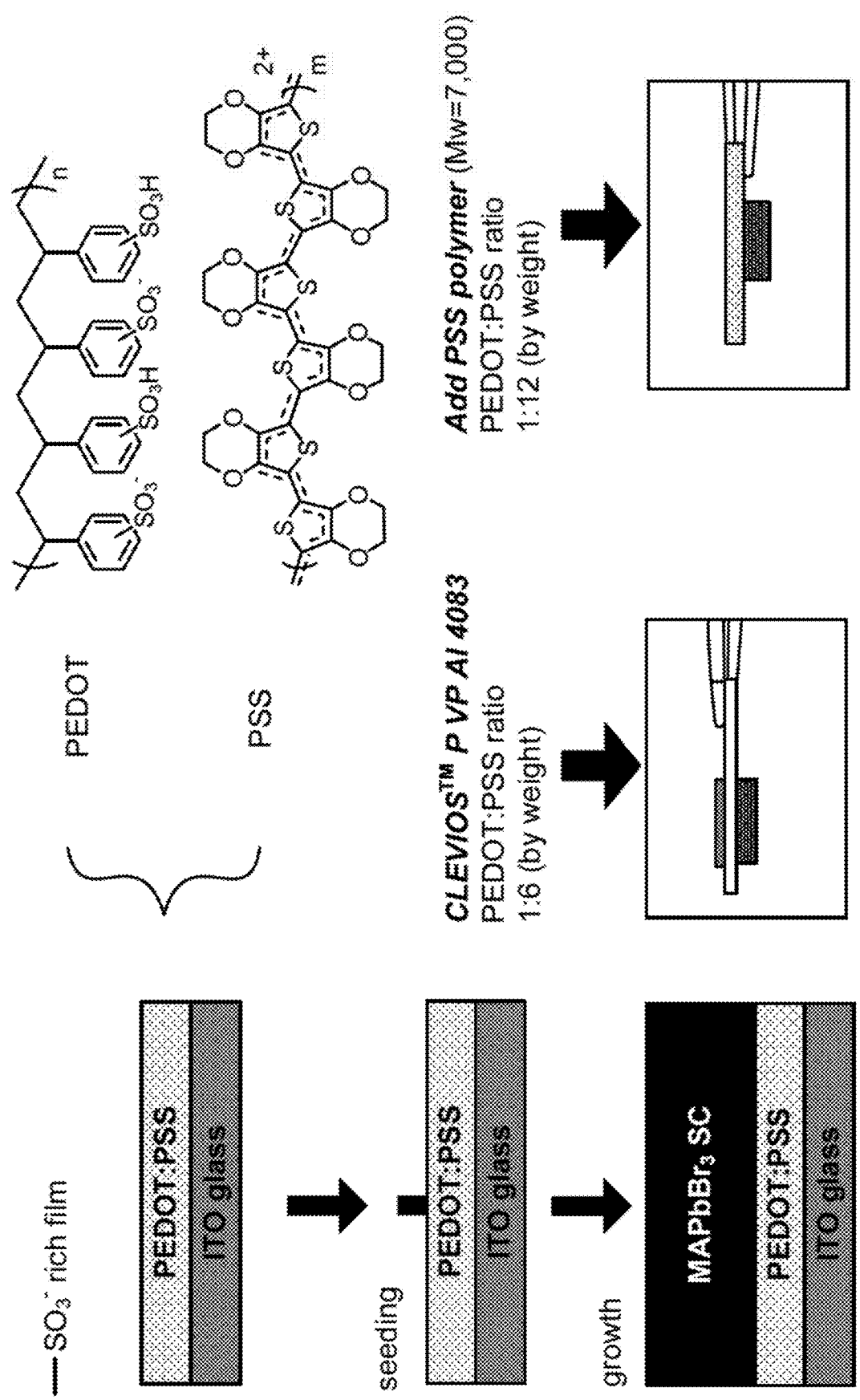
FIG. 11 is a schematic illustration of the fabrication of MAPbBr$_3$ SC on sulfonate groups-rich substrates according to an embodiment.

Organic functional groups (sulfonate, phosphate, carboxylate, et. al) have strong adhesion or bonding to heavy metal ions (i.e., Pb, Hg, Cd, et. al). In certain embodiments, hybrid perovskite single crystals can be integrated onto a sulfonate groups modified substrate (such as silicon, indium tin oxide (ITO) or other type of oxides, metals, and even glass) through a facile, low-temperature, solution process. The sulfonate groups-rich modified substrates show excellent absorption of Pb ions in the perovskite single crystal (see, e.g., FIG. 11), yielding a solid mechanical and electrical connection.

Figure 12:
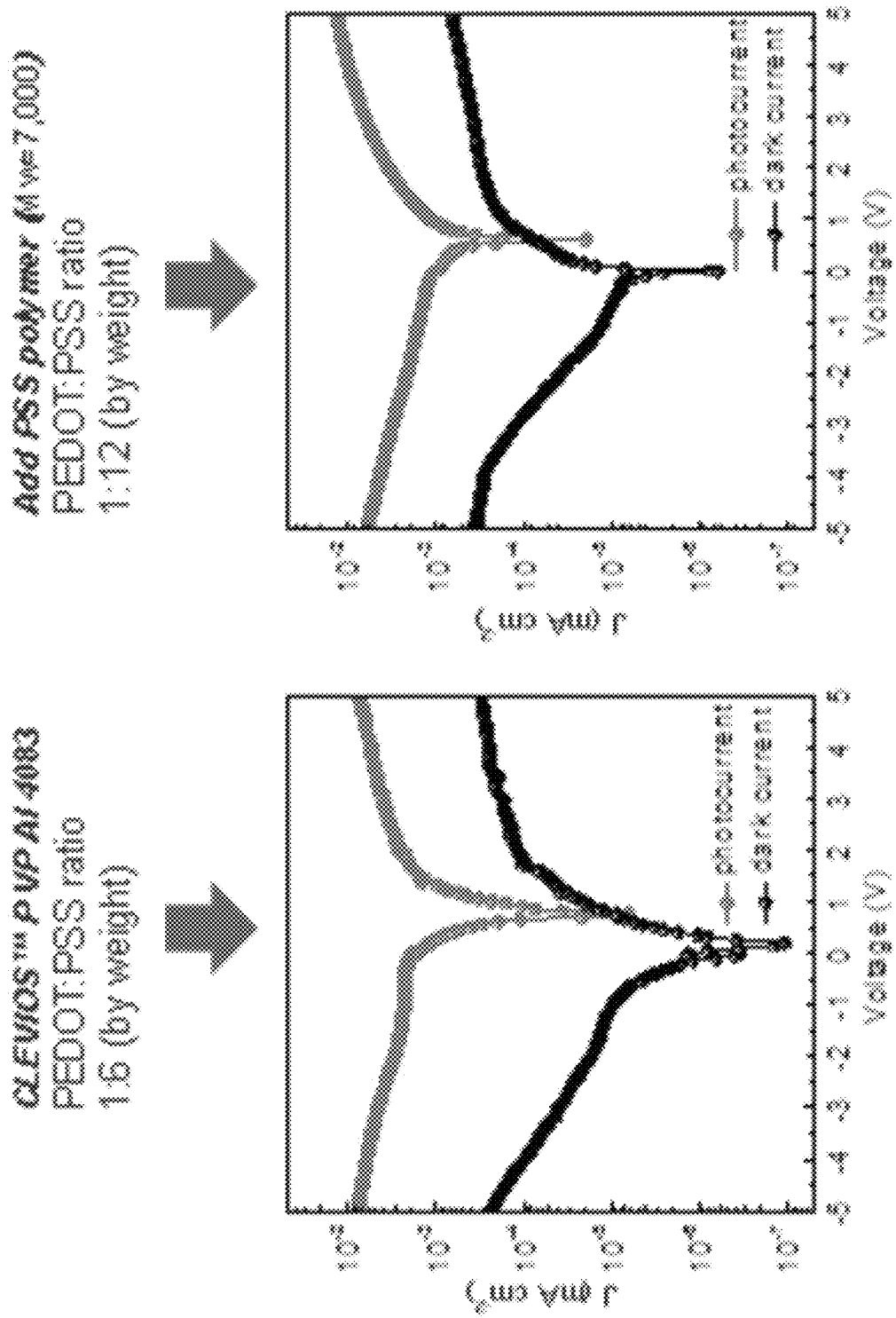
FIG. 12 shows I-V curves of a Cr/BCP/C$_{60}$/MAPbBr$_3$ single crystal/PEDOT:PSS/ITO device according to an embodiment.

The MAPbBr$_3$ SC on substrate can be further processed into the device by depositing the upper electrode. As shown in FIG. 12, sulfonate groups modified devices have similar dark current and photocurrent as the PEDOT:PSS ratio changes from 1:6 to 1:12, indicating similar charge transporting properties.

Examples

Materials. Methylamine bromine (MABr) (synthesized in the lab according to (see, U.S. Provisional Application Ser. No. 62/311,291, filed Mar. 21, 2016, titled "Sensitive X-Ray Detector Devices Including Organolead Trihalide Perovskite Single Crystals"), lead bromide ($PbBr_2$) (>98%, Sigma-Aldrich), hydrobromic acid (HBr) (48% w/w aq. soln., Alfa Aesar), (3-Aminopropyl)triethoxysilane (APTES) (>99%, Sigma-Aldrich), N,N-Dimethylformamide (DMF) (>99.8%, Alfa Aesar), 1,2-dichlorobenzene (DCB) (>99%, Sigma-Aldrich), 2-propanol (IPA) (>99.5%, Sigma-Aldrich), $C_{60}$ (>99.5%, Nano-C), BCP (>96%, Sigma-Aldrich).

Preparation of $NH_3Br$-terminated molecule functionalized Si substrate. Sandpaper polished and precleaned Si(p-type) wafer was placed into a mixture of DCB and APTES solvent (20:1) for 12 hours at 50° C. and ultrasonically rinsed with IPA to obtain $NH_2$-terminated molecules on the surface. Then the wafer was treated with HBr (aq) to convert the amino groups into —$NH_3Br$ groups.

Growth of Si-integrated $MAPbBr_3$ SC. $PbBr_2$ (2.31 g) and 0.67 g MABr (the molar ratio of $PbBr_2$ to MABr is 1.05) were dissolved in 6 ml DMF to form a clear solution and then filtered into a 50 ml beaker. A small droplet of the solution was dropped onto a glass coverslip by bringing the pipette tip into contact with the coverslip. Then the slip was placed on the top of the beaker with the droplet side face down. After the DMF solvent evaporated at room temperature, the $MAPbBr_3$ SC seed with a size of ~300 μm was generated on the coverslip. Subsequently, the $NH_3Br$-terminated molecule functionalized Si-wafer was put into the beaker, and the prepared seed was placed onto the wafer. Then the solution was heated to 70° C. and kept at temperature for 6-8 hours for the growth of the single crystal.

Device fabrication. The electron-transporting layers (20 nm $C_{60}$ and 8 nm BCP) and semi-transparent cathode (25 nm Au) were sequentially deposited on the top surface of the $MAPbBr_3$ SC through thermal evaporation.

Preparation of sulfonate groups functionalized substrate. The PEDOT:PSS polymers can be coated on the pre-cleaned substrates (such as ITO, Si) by spin-coating, and then the solvent removed by annealing 100~120° C. for several minutes. The PEDOT:PSS ratio is adjustable in order to change the content of sulfonate groups. Furthermore, the PSS can also be replaced by other molecules or polymers that contain high absorption groups (such as phosphate, carboxylate) for heavy metal ions (Pb).

Preparation of $MAPbBr_3$/DMF solution for the growth of single crystals. Lead bromide ($PbBr_2$) and Methylamine bromine (MABr) (the molar ratio of $PbBr_2$ to MABr is 1-1.05) were dissolved in dimethylformamide (DMF) to form a clear solution, the concentration is in the range of 0.7-1.6 M, and then filtered into a beaker.

Growth of $MAPbBr_3$ SC on functionalized substrate. The functionalized substrate was put into the beaker contained filtered $MAPbBr_3$/DMF solution with the modification side up, and the prepared seed was placed onto the substrate. Then the solution was heated to 25~70° C. and kept at temperature for 6-48 hours for the growth of the single crystal. The growth temperature and time depends on the concentration of the $MAPbBr_3$/DMF solution, high concentrated solution requires low temperature and long time for the growth. Correspondingly, low concentrated solution requires high temperature and short time for the growth. For example, if the $MAPbBr_3$/DMF solution is 1.6 M, the single crystal can be obtained after 48 h growth at 27° C., while the $MAPbBr_3$/DMF solution is 0.8 M, the single crystal can be obtained after 8 h growth at 75° C. The $MAPbBr_3$ SC on substrate can be further processing into the device by deposing the upper electrode.

FIG. 9 shows photoconductivity of a Si-integrated $MAPbBr_3$ SC device according to an embodiment. X-ray detection: An X-ray source was a commercially available Amptek Mini-X tube, with an Ag target and 4 watt maximum power output. X-rays from the source were collimated using a brass cylinder with a 2 mm circular central bore. The X-ray source with a continuum X-ray energy spectrum up to 50 keV and peak intensity at 22 keV were measured using a high-resolution Si—PIN detector. The air dose was measured using a Victoreen® 451B ion chamber at the sample location. The total X-ray dose was controlled by changing the current of the X-ray tube. The X-ray intensity was modulated by a thick steel chopper, and the current signal of the SC device was measured by a lock-in amplifier at the same frequency as the chopped X-ray. The current density signal generated with the X-ray dose rate was recorded.

Figure 10:
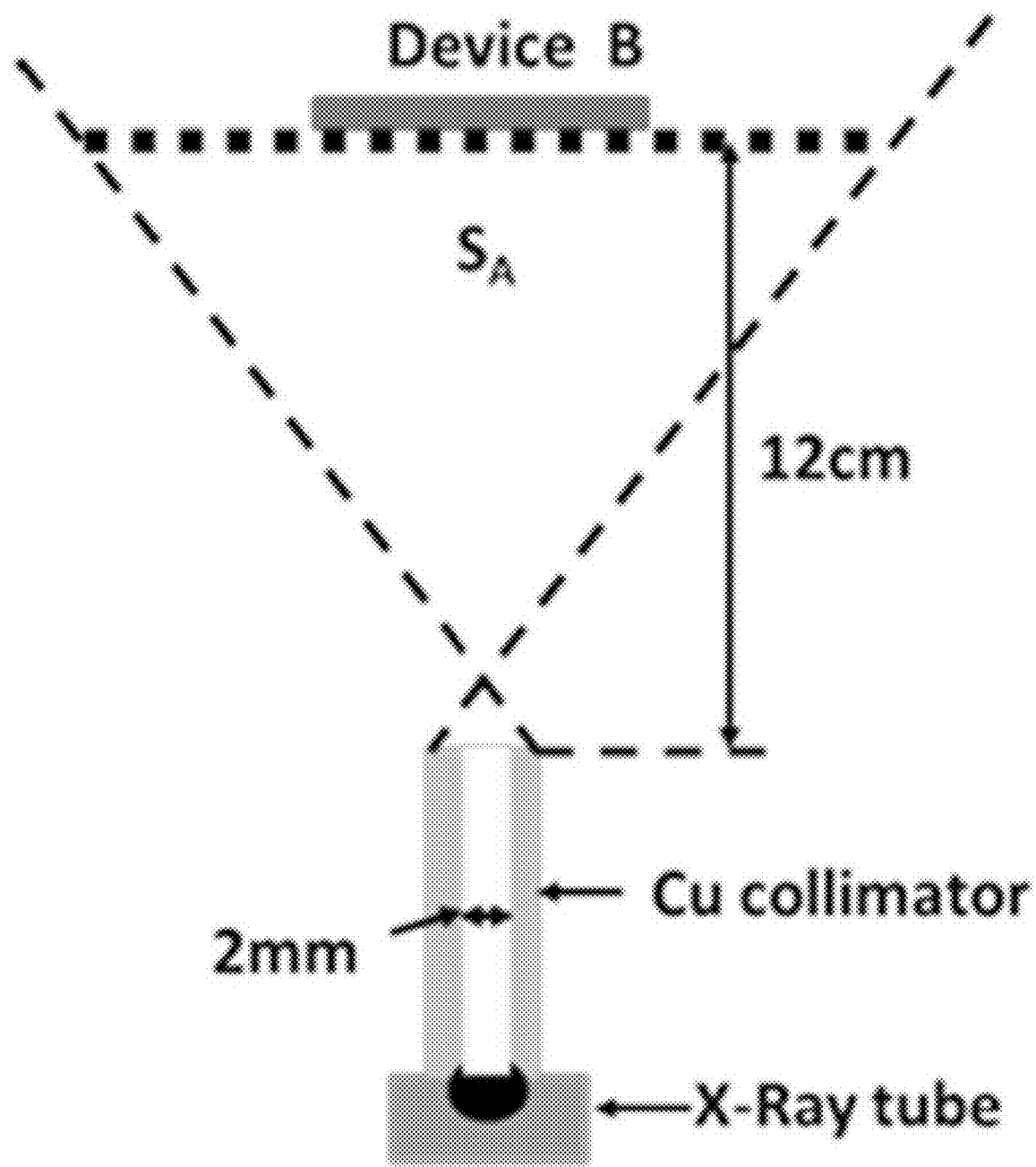
FIG. 10 shows a setup of the X-ray irradiation showing a device with an area B that is smaller than the X-ray beam area SA.

Concerning the area of the X-ray beam and the detector, the dose rate was calculated with the correction factor derived as below:

FIG. 10 shows an experimental setup for X-ray irradiation showing a device with an area B that is smaller than the X-ray beam area SA. SA is the cross-sectional area of X-ray beam at a distance of 12 cm from the beam collimator, which is a brass cylinder with a circular hole of 2 mm in diameter. The X-ray beam is divergent after emitting from a collimator. SA was measured by using a light-tight imaging box composed of a cooled CCD camera, a mirror, and an X-ray scintillator. SB is the surface area of the sample or device. The air dose rate, DA, on the surface SA was measured by using a Victoreen 451B Ion Chamber. The detection area of this ion chamber was much bigger SA. We assumed the X-ray beam was uniform. The dose rate DB on the surface of the device was calculated with the following relationship:

$$D_B = D_A \frac{S_B}{S_A}$$

Characterization.

Morphology: The morphology of silicon-integrated $MAPbBr_3$ SC was performed by scanning electron microscope (Quanta 200 FEG ESEM) and high resolution transmission electron microscopy (FEI OSIRIS, the cross-sectional samples were prepared by using focused-ion-beam equipment (FEI Helios 660)).

The two-dimensional XRD: The two-dimensional XRD pattern was measured with a Bruker-AXS D8 Discover Diffractometer.

Current density-voltage (J-V): The J-V curves were measured with a source-meter (Keithley 2400).

Workfunction of surfaces: The work function of surfaces was observed by Kelvin probe force microscopy (KPFM). A commercial AFM system (MFP-3D, Asylum Research, USA) and Pt/Ir-coated conductive probes (PPP-EFM, Nanosensors, Switzerland) were used to perform the KPFM measurement. A two-pass technique was employed. The first pass was used to acquire the topographic height; and then the conductive probe was lifted with respect to the specimen surface with a constant separation of 40 nm, approximately, and scanned to acquire the potential offset between the tip and the sample. An AC bias of 2 V amplitude at the first contact resonance frequency and a DC bias of 1 V were applied to the conductive probe.

External quantum efficiency (EQE): EQE was obtained with the Newport QE measurement kit by focusing a monochromatic beam of 35 Hz light onto the devices (optical power density was around 1 μW/cm², light intensity was calibrated with Si a diode).

Response time: The response time was measured by using a 532 nm laser with an intensity similar to the monochromatic light from the EQE instrument which was on the order of several microwatts per square centimeter (μW cm⁻²). The light was modulated by a chopper, and the photocurrent signal was recorded with an oscilloscope. The response time under bias was derived from the decay process of the curve.

Mobility and transit time: The nobility of silicon-integrated MAPbBr₃ SC was measured by the time-of-flight (ToF) method. The devices were illuminated by 337 nm laser pulses (SRS N₂ laser with 4 ns width) from the Au electrode. The pulse laser generating weak photocurrent was first amplified by a SR-570 current preamplifier, which had a bandwidth of 1 MHz, and then recorded using an Agilent 1 GHz digital oscilloscope (Agilent DSO-X 3104A). The hole mobility was calculated from Equation (s1).

$$\tau_{transit\ time} = \frac{d^2}{\mu V} \quad (s1)$$

where d is the thickness of the single crystals, V is the applied voltage bias, p is the charge carrier mobility, and τ is the transit time of the charge carriers. The built-in potential in the device is as follows.

Trap density: Trap density was measured by thermal admittance spectroscopy (TAS). The experiments were performed by using an Agilent E4980A Precision LCR Meter with frequencies between 0.1 and 1000 kHz. The device was kept under one sun illumination during the entire measurement time with the incident light coming from the ITO side. The energy profile of trap density of states (tDOS) was derived from the angular frequency dependent capacitance with Equation (s2).

$$N_T(E_\omega) = -\frac{V_{bi}}{qW}\frac{dC}{d\omega}\frac{\omega}{k_BT} \quad (s2)$$

where C is the capacitance, ω the angular frequency, q is the elementary charge, kB is the Boltzmann constant, and T is the temperature. $V_{bi}$ and W are the built-in potential and depletion width, respectively, which were extracted from the Mott-Schottky analysis. The applied angular frequency ω defined an energetic demarcation:

$$E_\omega = k_BT\ln\left(\frac{\omega_0}{\omega}\right),$$

where ω₀ is the attempt-to-escape frequency.

PL lifetime: The experiments were performed by using a DeltaPro™ filter-based lifetime system with a 404 nm laser excitation source without attenuation. The emitted fluorescence of the MAPbBr₃ SC was detected.

Noise, noise equivalent power (NEP), and specific detectivity (D)*: Noise current was measured at a different frequency by a Fast Fourier Transform (FFT) signal analyzer (Agilent 35670A) with a low noise current preamplifier. Specific detectivity was calculated according to Equation (s3).

$$D^* = \frac{(AB)^{1/2}}{NEP} \quad (s3)$$

where A is the device area, B is the bandwidth, and NEP is the noise equivalent power calculated from IQE and noise current.

Shot noise limit: The shot noise ($i_{n,s}$) was calculated by:

$$i_{n,s} = \sqrt{2eI_dB} \quad (s4)$$

where Id is the dark current, e is the elementary charge, and B is the bandwidth.

Photoconductivity: Photoconductivity measurement was carried out on the MAPbBr₃ SC device with a thickness of 2 mm and a device area of 32 mm². Excitation light from a 390 nm LED, modulated at 35 Hz by a function generator, was illuminated on the Au cathode of the device. Different reverse biases were supplied by a Keithley 2400 source meter, and photocurrent was recorded by a SR-830 lock-in amplifier. A fitting of the observed photocurrent versus reversed bias voltage using modified Hecht equations yields both pi product and the surface charge recombination rate s.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of fabricating a perovskite single crystal device structure, the method comprising:
   coating a substrate layer with a binding material layer to create a modified substrate surface, the binding material layer including a first functional group that bonds to an organolead trihalide perovskite structure and a second functional group that bonds with an oxide; and
   growing an organolead trihalide perovskite single crystal structure on the modified substrate surface.

2. The method of claim 1, wherein growing includes providing an organolead trihalide perovskite seed structure on the modified substrate and growing the seed structure in a $PbBr_2$:MABr precursor solution.

3. The method of claim 2, wherein the precursor solution has a ratio of $PbBr_2$:MABr of about 0.6 to about 1.5.

4. The method of claim 1, wherein the substrate layer includes $SiO_2$.

5. The method of claim 1, wherein the substrate layer includes $iO_2$, ZnO, ITO, or other hydroxyl-rich oxide or metal.

6. The method of claim 1, wherein the binding material layer comprises brominated (3-aminopropyl)triethoxysilane (APTES).

7. The method of claim 1, wherein the organolead trihalide perovskite single crystal structure includes a perovskite single crystal having a structure of $APbX_3$, wherein A is methylammonium ($CH_3NH_3^+$), $Cs^+$, $Ru^+$, or formamidinum ($H_2NCH=NH_2^+$), and X is a halide anion, thiocyanate (SCN—) or a mixture thereof.

8. The method of claim 1, the organolead trihalide perovskite single crystal structure includes a perovskite single crystal having a structure of $MAPbBr_3$, wherein MA is methylammonium ($CH_3NH_3+$).

9. The method of claim 1, wherein the organolead trihalide perovskite single crystal is grown to a thickness of between about 0.001 mm and about 100 mm.

10. The method of claim 1, further including roughening a surface of the substrate prior to the coating.

11. A method of fabricating a perovskite single crystal device structure, the method comprising:
    coating a silicon substrate layer with a binding material layer to create a modified substrate surface, the binding material layer including brominated (3-aminopropyl) triethoxysilane (APTES) or PEDOT:PSS or molecules that contain one of sulfonic acid groups, phosphate and carboxylate; and
    growing an organolead trihalide perovskite single crystal structure on the modified substrate surface, the organolead trihalide perovskite single crystal structure having a composition of $MAPbBr_3$, wherein MA is methylammonium ($CH_3NH_3^+$).

12. The method of claim 11, wherein the molecules have a formula R—X where R includes aliphatic or aromatic groups, and X includes one of —$NH_2$ group, sulfonic acid groups, phosphate and carboxylate.

13. The method of claim 12, wherein R includes one of —$(CH_2)_nCH_3$, —$(CH_2)_nNH_2$, —$(CH_2)_nSi(OC_2H_5)_3$, —$(CH_2)_nSi(OCH_3)_3$, or —$(CH_2)_nCF_3$.

14. The method of claim 11, wherein the silicon substrate layer includes $SiO_2$.

15. The method of claim 11, wherein the organolead trihalide perovskite single crystal structure is grown to a thickness of between about 0.001 mm and about 100 mm.

16. The method of claim 11, further including roughening a surface of the silicon substrate layer prior to the coating.

* * * * *